(12) United States Patent
Clamp et al.

(10) Patent No.: US 6,302,190 B1
(45) Date of Patent: Oct. 16, 2001

(54) COOLING AN ENGINE CONTROL UNIT

(75) Inventors: Andrew Clamp, County Durham; John J. Purcell, Marlow, both of (GB)

(73) Assignees: Cummins Engine Company Ltd., Darlington; Iveco (UK) Ltd., Watford; New Holland U.K. Ltd., Basildon, all of (GB)

( * ) Notice: Subject to any disclaimer, the term of this patent is extended or adjusted under 35 U.S.C. 154(b) by 0 days.

(21) Appl. No.: 09/343,007

(22) Filed: Jun. 29, 1999

(30) Foreign Application Priority Data

Jun. 30, 1998 (GB) .................................................. 9814082

(51) Int. Cl.[7] .................................. F28F 7/00; F28F 3/12
(52) U.S. Cl. ........................................... 165/80.4; 165/169
(58) Field of Search .................................. 165/80.4, 169, 165/170, 41

(56) References Cited

U.S. PATENT DOCUMENTS

| | | | |
|---|---|---|---|
| 3,996,914 | * 12/1976 | Crall et al. ........................ | 123/198 E |
| 4,072,188 | * 2/1978 | Wilson et al. ........................ | 165/80.4 |
| 4,543,914 | * 10/1985 | Harris ............................... | 123/41.31 |
| 4,559,995 | * 12/1985 | Van Der Stuyf ..................... | 165/41 |
| 4,763,611 | * 8/1988 | Kobayashi et al. ............... | 123/41.31 |
| 5,159,529 | * 10/1992 | Lovgren et al. .................... | 165/80.4 |
| 5,207,186 | * 5/1993 | Okita ................................. | 123/41.31 |
| 5,269,372 | * 12/1993 | Chu et al. .......................... | 165/80.4 |

* cited by examiner

*Primary Examiner*—Ira S. Lazarus
*Assistant Examiner*—Tho Duong
(74) *Attorney, Agent, or Firm*—Gary M. Gron

(57) ABSTRACT

A chill plate 30 is described for cooling an electronic control unit (ECU) 20 of an engine. The chill plate 30 comprises a housing 32 having a flat front face onto which the ECU 20 may be mounted, formed with a central pocket 36 for accommodating any components 28 protruding from the rear face of the ECU. The housing also includes flow passages 40 through which fuel may flow around at least part of the periphery of the central pocket 36 to transfer heat to the fuel from the regions of the front face 38 surrounding the pocket 36.

10 Claims, 6 Drawing Sheets

COOLING AN ENGINE CONTROL UNIT

FIELD OF THE INVENTION

The present invention relates to the cooling of an electronic control unit (ECU) of an engine, in particular a diesel engine.

BACKGROUND OF THE INVENTION

Engine mounted ECUs operate in a hot and hostile environment making it necessary to take special steps to cool the engine electronic control unit, because the function of electronic components may be impaired if they are overheated. Additionally, the heat generated by the ECU will shorten the life of the ECU if not transferred away.

It has previously been proposed to provide a heat exchanger(commonly called a chill plate) for supporting and cooling an ECU. The chill plate comprises a coolant chamber which, in use, is connected in a supply line through which passes the fuel flowing from a fuel tank to the engine. The chill plate serves to cool the ECU module by transferring heat to the fuel supplied to the engine. The known chill plates, however, have the disadvantage that they can only be used with ECUs having a flat heat sink of conductive material to which the heat generating electronic components are attached.

OBJECT OF THE INVENTION

The present invention seeks to provide a chill plate that can be used with different types of ECU, including ECUs having components that protrude beyond the surface of a flat heat sink to be cooled. Additionally, this design can be incorporated directly into the ECU housing if appropriate.

SUMMARY OF THE INVENTION

In accordance with the present invention, there is provided a chill plate for cooling an electronic control unit (ECU) of an engine, comprising a housing having a flat front face onto which the ECU may be mounted, formed with a central recess for accommodating any components protruding from the rear face of the ECU and flow passages within the housing through which fuel may flow around at least part of the periphery of the central pocket to transfer heat to the fuel from the regions of the front face surrounding the pocket.

BRIEF DESCRIPTION OF THE DRAWINGS

The invention will now be described further, by way of example, with reference to the accompanying drawings, in which.

DETAILED DESCRIPTION OF THE PREFERRED EMBODIMENT

Figure 3:
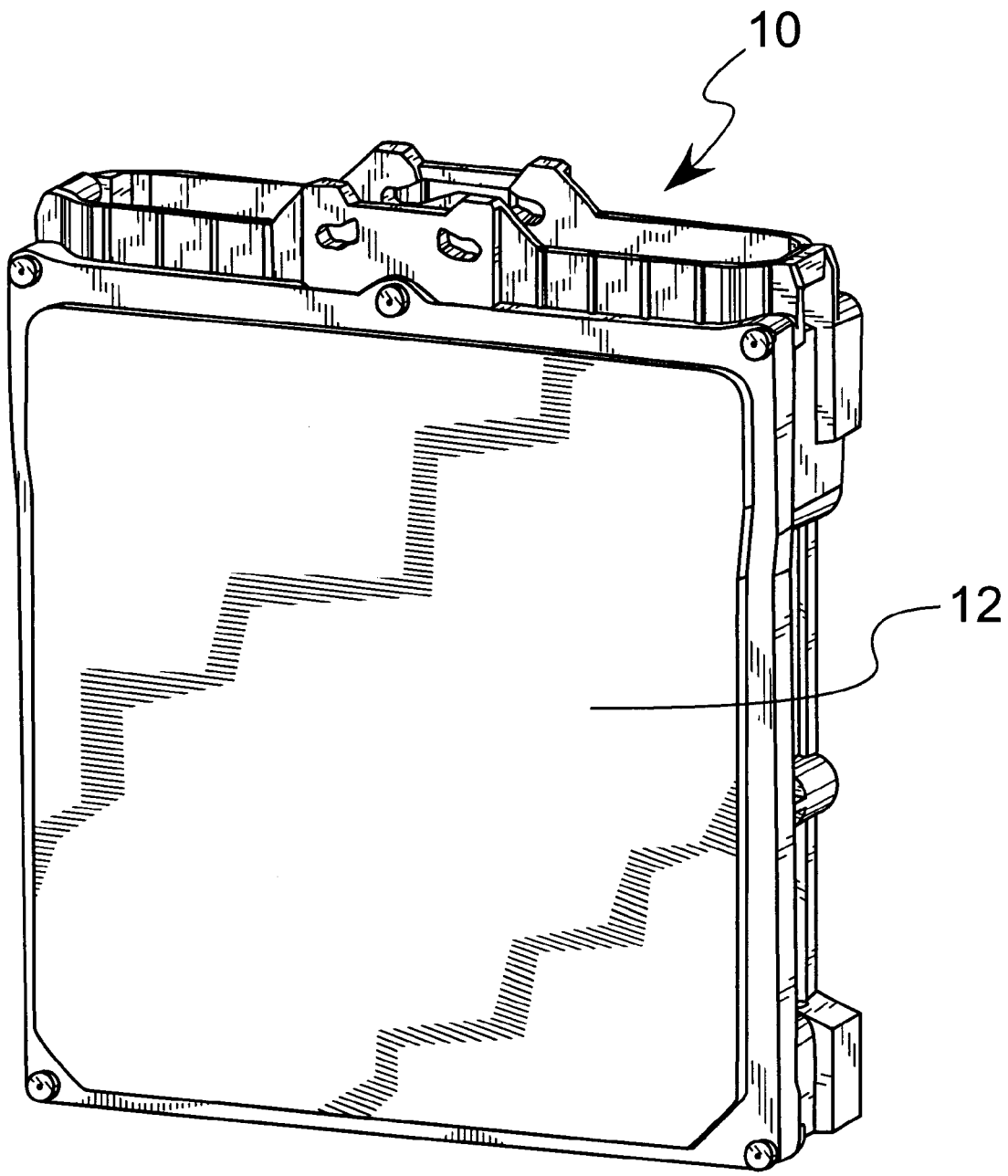
FIG. 3 is a perspective view of a first type of ECU that may be mounted in the chill plate of FIGS. 1 and 2, FIGS. 4 and 5 are front and rear views, respectively of a second type of ECU that may be mounted on the chill plate of FIGS. 1 and 2.

FIG. 3 shows a prior art type of ECU 10 that is currently available and in use in engine management systems. This ECU 10 presents no particular problem as it has a flat rear face 12 that needs to be cooled around its periphery. Such an ECU can be cooled using a flat chill plate, as already known in the prior art.

Figure 4:
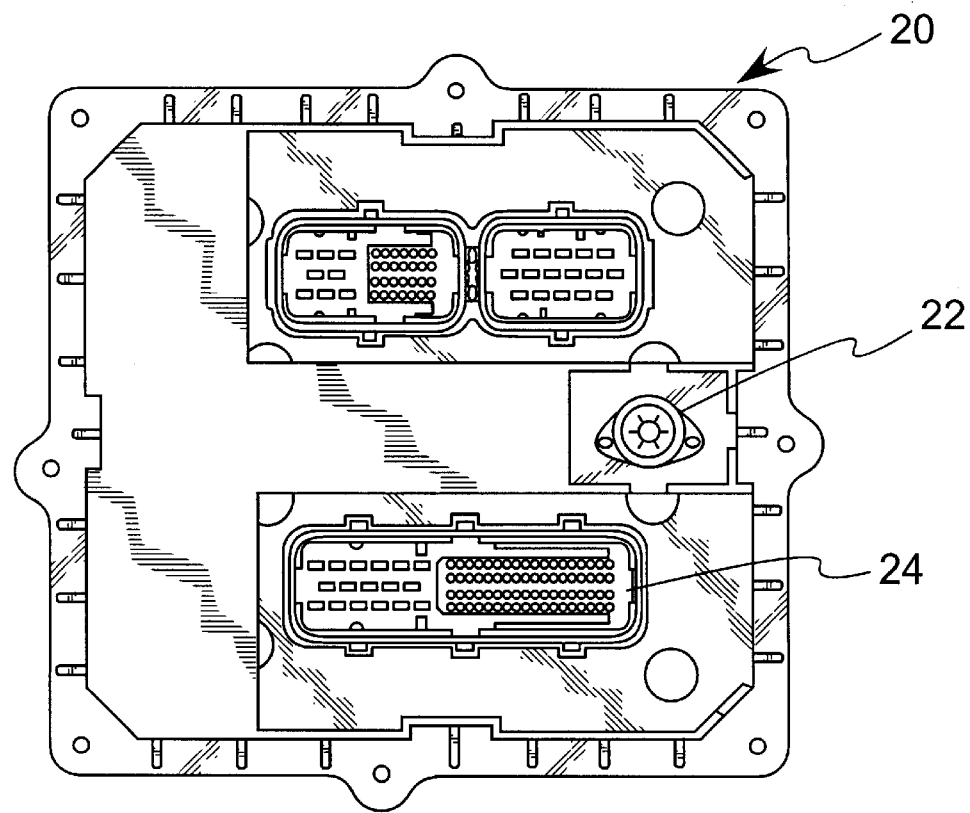
Figure 5:
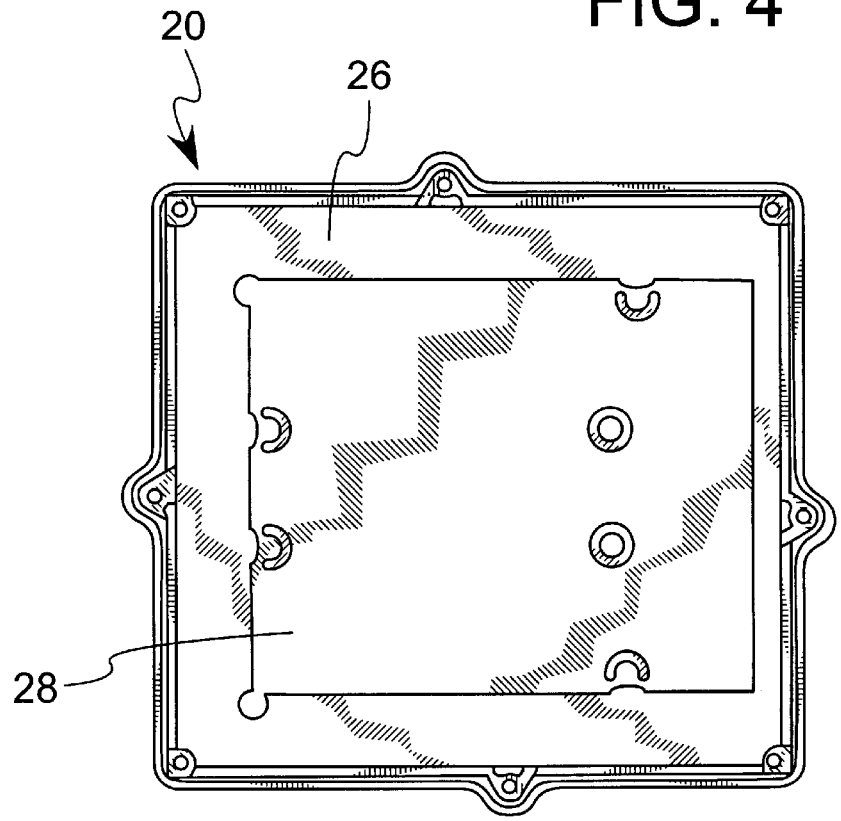

FIGS. 4 and 5 on the other hand show a different type of ECU 20 that is also currently in use and differs from that of FIG. 3. On its front face, the ECU 20 has various electrical connection terminals 22, 24. On its rear face, the ECU 20 has a surface 26 that needs to be cooled and a box 28 that protrudes from that surface. The parts of the rear surface 26 that need to be cooled are shown using shading lines and it will be clear that such an ECU cannot be cooled using a flat chill plate as the protruding box 28 would prevent the parts of the rear surface 26 that need to be cooled from contacting the chill plate.

Figure 1:
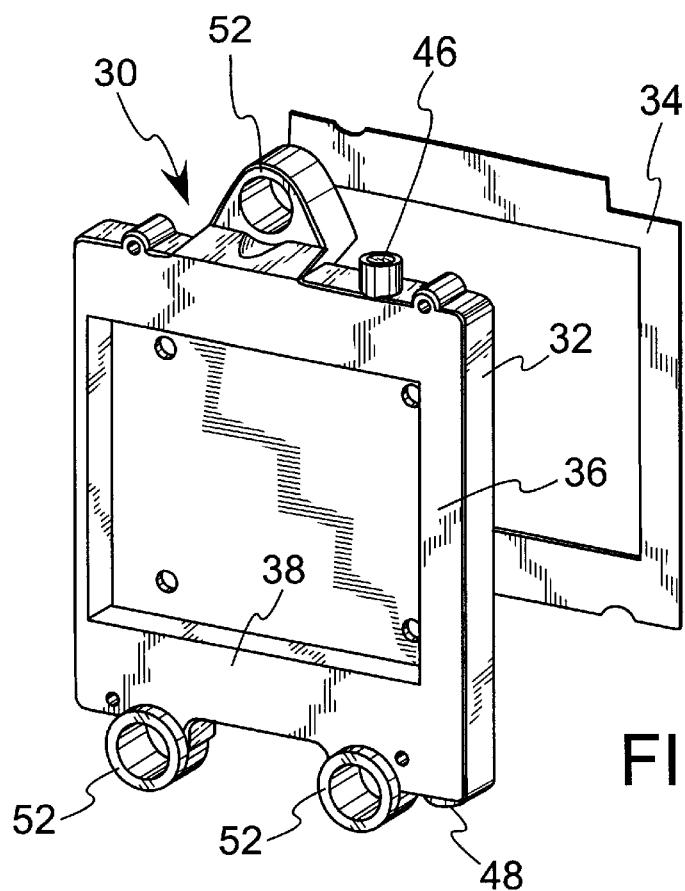
FIG. 1 is an exploded front view of a chill plate of the invention.
Figure 2:
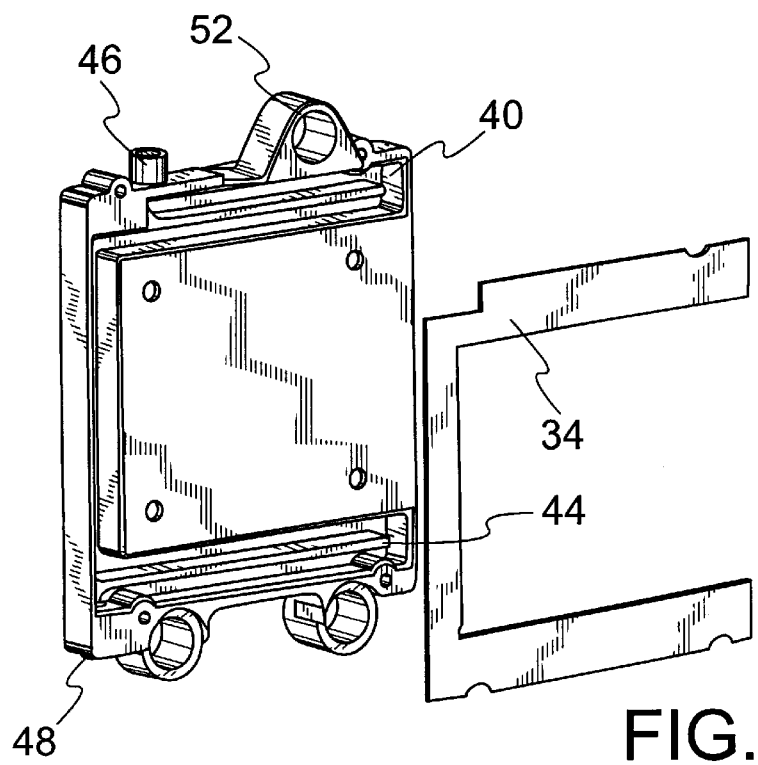
FIG. 2 is an exploded rear view of the chill plate in FIG. 1.

To mitigate this problem and allow the same chill plate to be used with types of ECU described above, the invention provides a chill plate 30 that is shown in FIGS. 1 and 2.

The chill plate 30 is formed of two parts that are welded to each other, namely an aluminum casting 32 and a cover plate 34. The casting defines a pocket 36 recessed into the flat front face 38 of the chill plate, which pocket is surrounded on three sides by a channel 40 of U-shaped configuration. When the cover plate 34 is welded or otherwise affixed to the channel 40 in a fluid sealing arrangement, flow conduits are formed for fuel that enters the chill plate 30 through a fuel inlet 46 and leaves through a fuel outlet 48. Two partition walls 42, 44 are cast into the upper and lower sides of the channel 40, respectively, to constrain the fuel to follow a convoluted flow path through the flow conduit to increase residence time and the effective heat transfer from the electronic components In use, as may be seen from the section of FIG. 6 and the exploded perspective view of FIG. 7, the ECU 20 of FIGS. 3 and 4 can be mounted on the chill plate because its protruding box 28 can be accommodated in the pocket 36. The chill plate is connected in series in the pipe leading from the fuel tank to the fuel injection system of the engine. The fuel follows the path shown by the arrow 50 in FIG. 7. In particular, the fuel enters from the inlet 46, traverses the upper side of the channel 40 twice, descends along the vertical side and traverses the lower side of the channel 40 twice before leaving through the outlet 48. In the process, the fuel extracts heat from the periphery of the front surface 38 of the chill plate 30 which is in thermal contact with the surface 26 of the ECU 20 that requires cooling.

The chill plate 30 is intended for mounting directly on the engine. To reduce transmission of engine vibrations to the ECU, the chill plate has three engine mounting bosses 52 that are designed to receive rubber bushes 54 (FIG. 6) which are positioned between the bosses 52 and mounting screws 55 which attach to the engine receiving the ECU 20. These bushes absorb shocks and vibrations and also provide thermal isolation between the chill plate 30 and the engine on which it is mounted.

It will be clear that the chill plate 30 can equally well accept an ECU of the type shown in FIG. 3 that has no protrusions that inhibit the surface to be cooled from being brought into thermal contact with the cooling surface of the chill plate 30.

Figure 8:
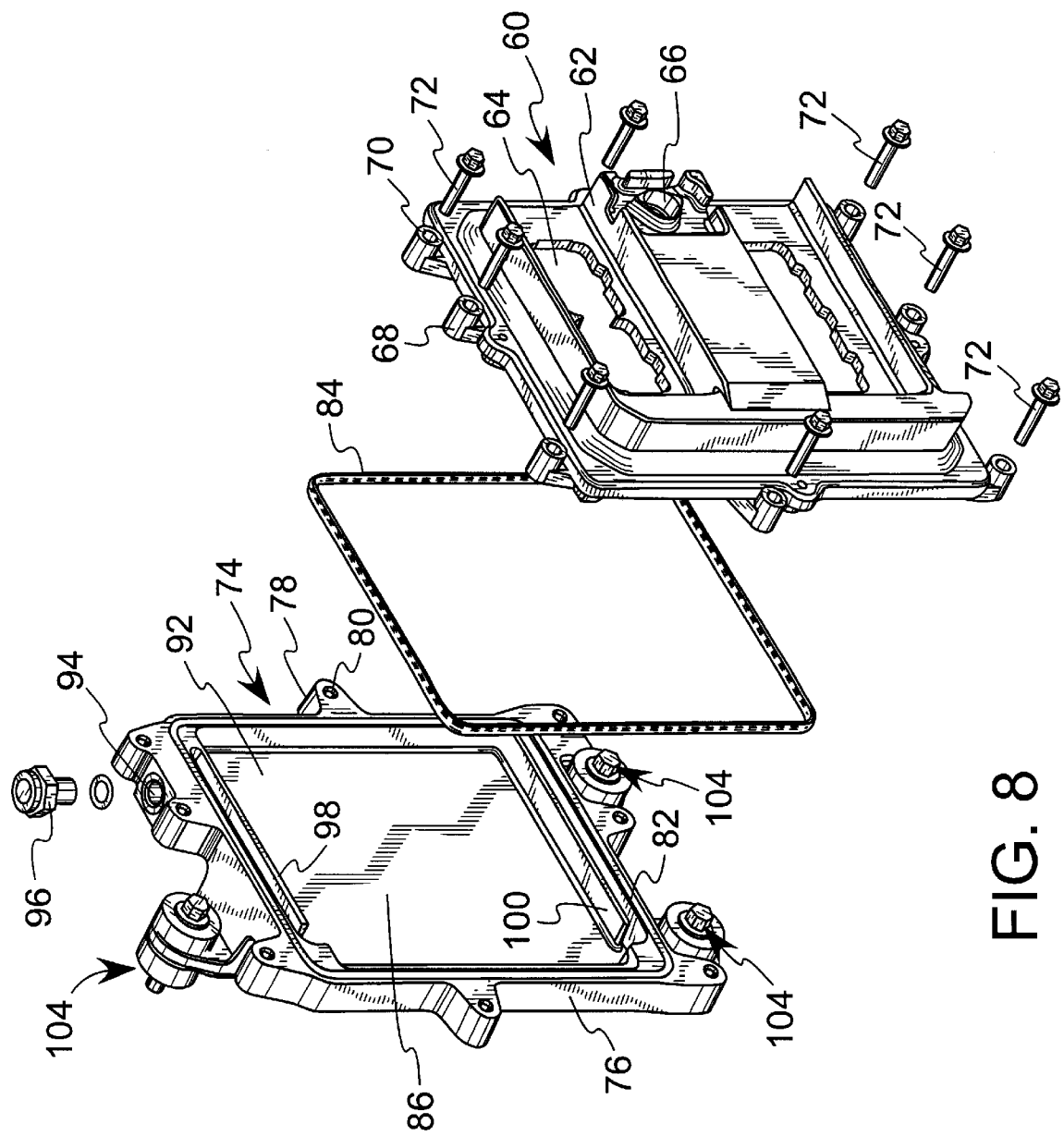
FIG. 8 is an exploded perspective view of a chill plate illustrating an alternative embodiment of the present invention.
Figure 9:
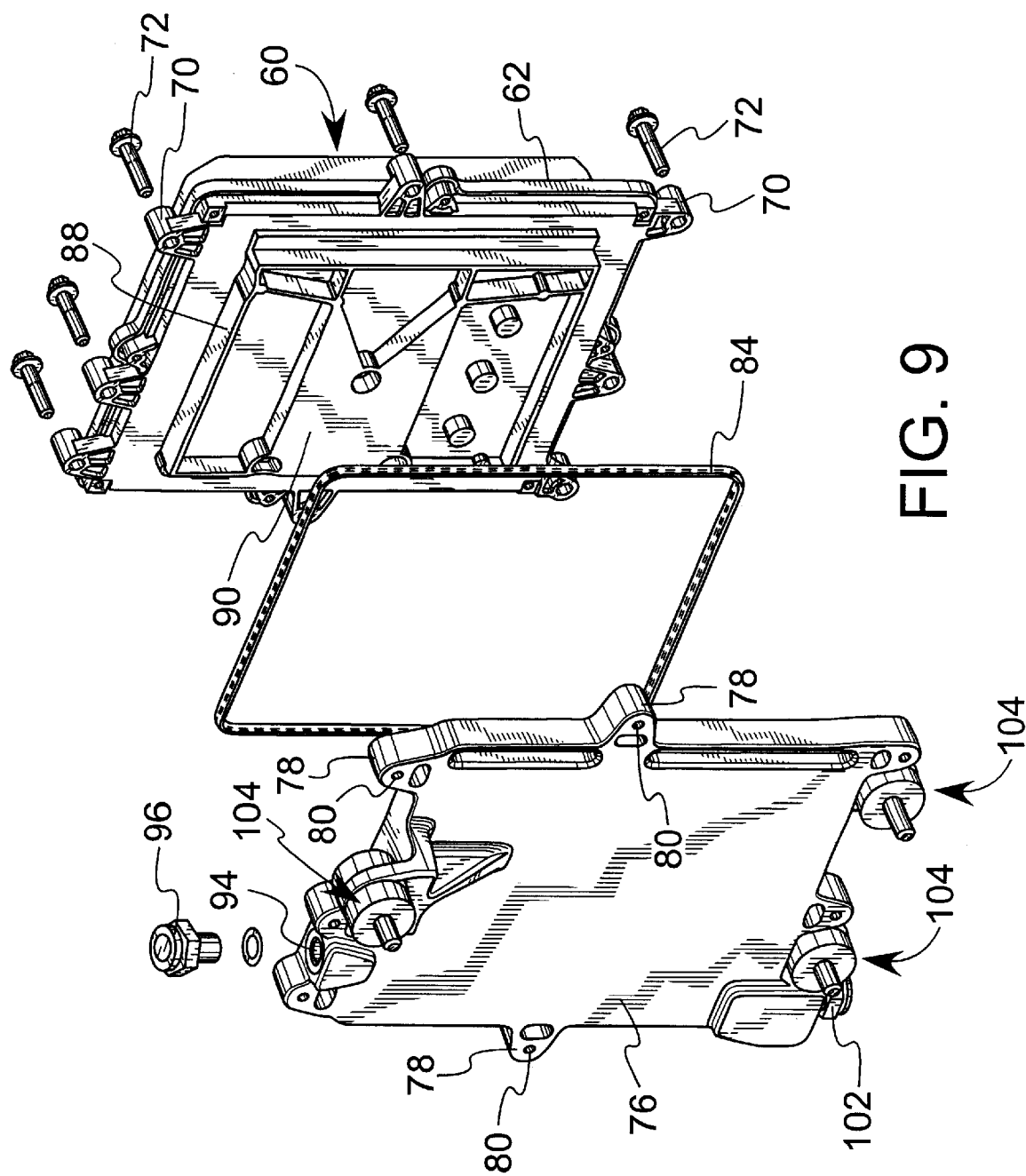
FIG. 9 is an exploded view of the chill plate of FIG. 8, taken in the direction indicated by arrow 9—9 of FIG. 8.

Referring now to FIGS. 8 and 9, there is shown an alternate chill plate arrangement which eliminates the need for the cover 34 and the need to have a fluid sealed joint between the cover and the chill plate. An ECU 60 like the ECU 20 described above comprises a formed housing 62 having openings 64, 66 for receiving the electrical connectors 24, 22, respectively which are shown in FIG. 4. The housing 62 has a series of integral peripheral bosses 68 having through holes 70 which receive mounting screws 72. A chill plate 74 comprises a formed housing 76 of aluminum or other heat conductive material. The housing 76 has a series of peripheral bosses 78 incorporating threaded holes 80 which receive mounting screws 72 for securing the housing 62 to the chill plate housing 76. Housing 76 has a continuous perimeter groove 82 which receives a resilient continuous seal 84 to provide a fluid seal around the perimeter of a central recess 86 in the chill plate housing 76. As shown particularly in FIG. 9, the recess 86 receives a box 88 similar to the box 28 shown in FIG. 5. It should be noted that the box 88 has a surface 90 defining the maximum depth it protrudes into recess 86. This depth is selected to be closely adjacent the floor 92 of recess 86. A fuel inlet 94 receives a fitting 96 connected to the engine fuel supply(not shown). The inlet 94 leads to the recess 86, but a baffle 98 causes the fuel to flow through a circuitous path like the path shown in FIG. 2. Because the surface 90 of box 88 is closely adjacent the floor 92 of recess 86, the fuel is forced to flow around the periphery of the box 88 like the flow of the arrangement of FIGS. 1 and 2. Any fuel which passes between the wall 98 and floor 92 will be in a dead zone having no significant flow. After the fuel has traversed the periphery of the box 88, it is deflected by a second baffle 100 which leads to a fuel outlet 102(see FIG. 9).

Figure 6:
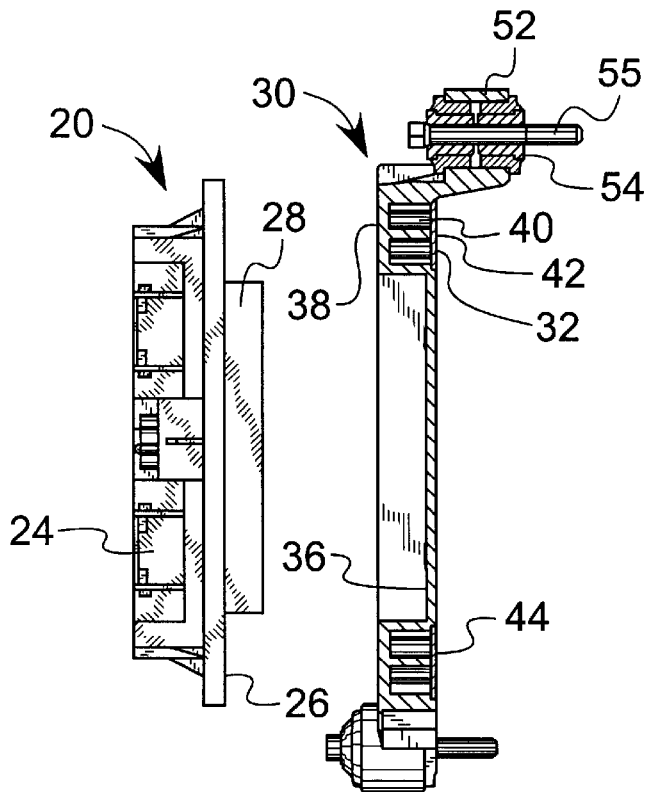
FIG. 6 is an exploded vertical central section through the chill plate of FIGS. 1 and 2 and an ECU of the second type.
Figure 7:
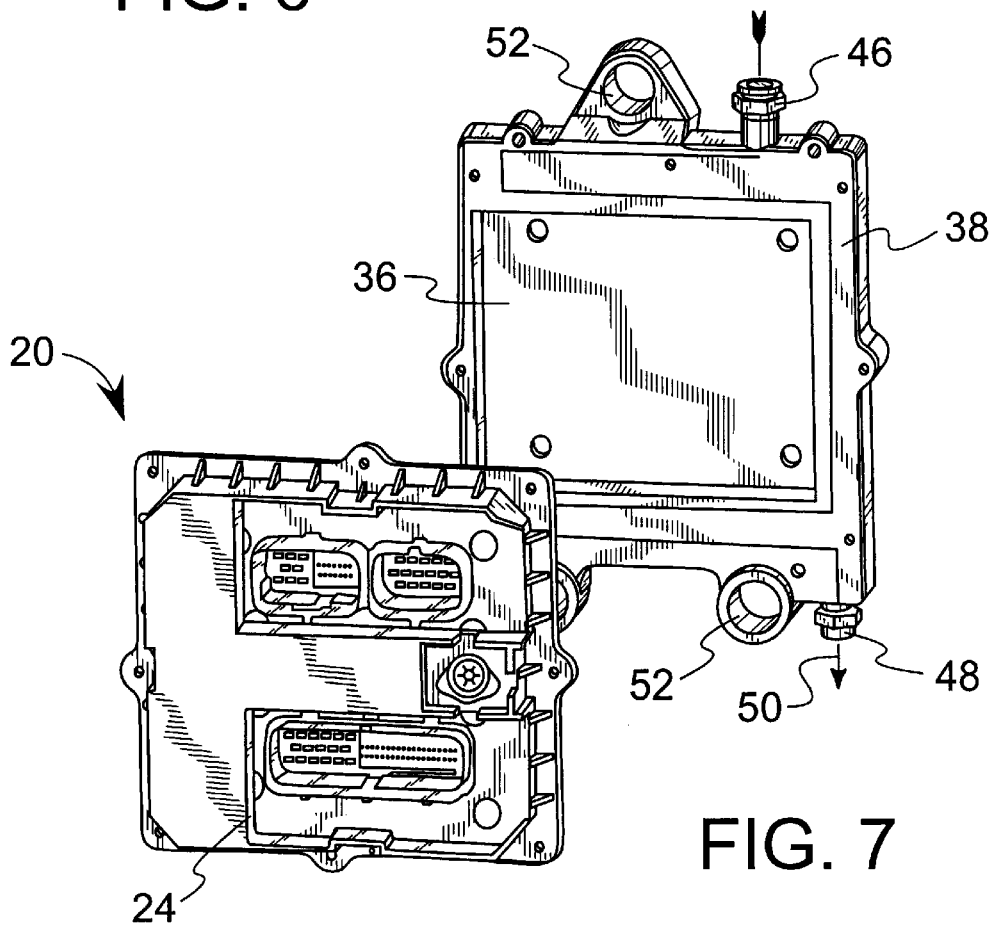
FIG. 7 is an exploded perspective view of the chill plate of FIGS. 1 and 2 and an ECU of the second type.

It should be noted that a three point mounting system 104, like the one described in connection with FIG. 6 is provided to secure the assembly to an engine.

Conventional ECUs have a metal backing plate with the result that when the ECU is fitted to a chill plate, there will be two layers of metal between the liquid coolant and the circuit components to be cooled. The present invention dispenses with the need for a separate backing plate for the ECU and instead forms the chill plate as part of the ECU housing.

Thus, all of the features described above can be manufactured directly into the ECU housing instead of a separate housing for high volume applications. The ECU housing would accept these features exactly the same as a separate housing and cover assembly. The ability to accept non-flat ECU's is automatically accomplished also if this design is implemented directly into the ECU housing.

In order to further improve the thermal efficiency of the chill plate, the flow path for fuel comprises one or more baffles such that the fuel in the chill plate is constrained to follow a convoluted path.

While several preferred embodiments of the present invention have been described, it should be apparent to those skilled in the art that they may be practised other than specifically shown without departing for the spirit and scope thereof.

Having thus described the invention, what is novel and desired to be secure by Letters Patent of the United States is:

1. A chill plate for cooling an electronic control unit (ECU) of an engine, said ECU having a front face to which electrical connections are made and a rear face from which a box protrudes, said box containing heat generating electrical components around its perifery, said chill plate comprising a housing having a flat front face onto which the ECU is mounted and formed with a central recess for said box, and means for forming flow passages within the housing through which fuel flows substantially only around at least part of the periphery of the central recess to transfer heat to the fuel from the periphery of the box extending into the recess.

2. A chill plate as claimed in claim 1, further comprising mounting bosses formed on said housing and shock and vibration absorbing rubber bushes received in said mounting bosses thereby allowing the chill plate to be mounted directly on an engine.

3. A chill plate as claimed in claim 1 wherein the housing is formed of a metal casting defining an open channel surrounding three sides of the central pocket, and a cover plate for closing the open channel to constitute the fuel flow passages.

4. A chill plate as claimed in claim 3, wherein the cover plate is welded to the metal casting.

5. A chill plate as claimed in claim 4, wherein the open channel comprise one or more partitions such that the fuel in the flow conduits is constrained to follow a convoluted path.

6. A chill plate as claimed claim 1, wherein said flow passage means is formed in part ECU box.

7. A chill plate as claimed in claim 1 wherein the housing is formed from a heat conductive material having a central recess with a bottom floor receiving the ECU box, said ECU box extending into said recess to a point closely adjacent said bottom floor to constrain the fuel to flow in a path around at least a part of the periphery of said central recess.

8. A chill plate as claimed in claim 7 further comprising a continuous seal element extending around the periphery of said central recess for sealing fuel therein.

9. A chill plate as claimed in claim 8 wherein said housing has fuel inlet and outlets and said chill plate further comprises baffles adjacent said inlet and outlet for forcing the fuel to flow in a convoluted path for increasing heat transfer.

10. A chill plate as claimed in claim 9 further comprising a plurality of screws for releasably fastening said ECU to said chill plate.

* * * * *